(12) United States Patent
Level et al.

(10) Patent No.: US 6,822,593 B2
(45) Date of Patent: Nov. 23, 2004

(54) DIGITAL TO DIGITAL SIGMA-DELTA MODULATOR AND DIGITAL FREQUENCY SYNTHESIZER INCORPORATING THE SAME

(75) Inventors: Philippe Level, Saint-Egreve (FR); Serge Ramet, Grenoble (FR); Laurent Camino, Grenoble (FR)

(73) Assignee: STMicroelectronics SA., Montrouge (FR)

( * ) Notice: Subject to any disclaimer, the term of this patent is extended or adjusted under 35 U.S.C. 154(b) by 0 days.

(21) Appl. No.: 10/447,326

(22) Filed: May 28, 2003

(65) Prior Publication Data

US 2004/0036634 A1 Feb. 26, 2004

(30) Foreign Application Priority Data

May 28, 2002 (FR) .............................. 02 06500

(51) Int. Cl.[7] ................................................ H03M 3/00
(52) U.S. Cl. ...................................... 341/143; 341/144
(58) Field of Search ................................. 341/143, 144, 341/120, 118

(56) References Cited

U.S. PATENT DOCUMENTS

| | | | | |
|---|---|---|---|---|
| 5,068,661 A | * | 11/1991 | Kaneaki et al. | ............. 341/143 |
| 5,341,135 A | * | 8/1994 | Pearce | .......................... 341/120 |
| 5,548,286 A | * | 8/1996 | Craven | .......................... 341/126 |
| 6,344,812 B1 | | 2/2002 | Takeda et al. | |
| 6,614,377 B1 | * | 9/2003 | Adams et al. | ............... 341/144 |

FOREIGN PATENT DOCUMENTS

JP          08 256061          10/1996

OTHER PUBLICATIONS

Harris, F.;"A Modified Delta–Sigma Quantizer to Obtain High Resolution A/D Conversion with Small Excess Sample Rates"; Proceedings of the Asllomar Conference on Signals, Systems and Computers. Pacific Grove, Oct. 31—Nov. 2, 1988; New York, IEEE; vols. 1 & 2 Conf. 22; pp. 622–625; XP000130325.

Magrath, A. J., et al.; A Sigma–Delta Modulator Topology with High Linearity: Circuits and Systems, 1997: ISCAS '97: Proceedings of 1997 IEE International Symposium on Hong Kong Jun. 9–12, 1997: New York, pp. 53–56; XP010235973.

* cited by examiner

*Primary Examiner*—Brian Young
*Assistant Examiner*—Joseph Lauture (57) ABSTRACT

A digital to digital Sigma-Delta modulator comprises an input which receives a digital input value encoded over N bits, an output which delivers a digital output value encoded over n bits, where n is less than N, and at least a first Sigma-Delta cell which includes a quantizer having a quantization interval which is a prime number. The choice of a prime number decreases the power of the limit cycles (lines with a power value higher than the local mean value) which may appear depending on the input code of the modulator and on the initial conditions. Application is proposed to a digital frequency synthesizer.

20 Claims, 5 Drawing Sheets

DIGITAL TO DIGITAL SIGMA-DELTA MODULATOR AND DIGITAL FREQUENCY SYNTHESIZER INCORPORATING THE SAME

BACKGROUND OF THE INVENTION

1. Technical Field

The present invention relates to digital to digital Sigma-Delta modulators ($\Sigma$-$\Delta$ modulator). In particular, it is applicable to digital frequency synthesizers or DMS (Digitally Modulated Synthesizer) circuits. Such circuits are especially used in the radio frequency transmitters of mobile terminals or of stationary stations of a radio communications system.

A digital to digital $\Sigma$-$\Delta$ modulator is a device for encoding a digital signal using a small number of steps, and a sampling frequency which is high compared to the passband of the signal to be encoded. This device shapes the spectrum of the quantization noise by pushing its power back into a frequency band not occupied by the spectrum of the useful signal. This spectral separation makes it possible, by filtering the encoded signal, to retain a signal-to-noise ratio complying with given specifications.

2. Related Art

A known digital to digital Sigma-Delta modulator comprises:

- an input in order to receive a digital input value encoded over a given number N of bits, where N is a specified integer;
- an output in order to deliver a digital output value encoded over a given number n of bits, where n is a specified integer less than N; and
- one or more Sigma-Delta cells placed between the input and the output of the modulator.

Each cell may be of the first order or of a higher order. When the modulator comprises several cells, the latter may be arranged according to a structure known to the one skilled in the art by the name of "MASH structure". In this case, the cells are often identical to each other, but this is not mandatory. In particular, some may be of the first order, and others of a higher order.

In all cases, each Sigma-Delta cell comprises, at a minimum, the following elements:

- a subtractor comprising a first input, a second input, and an output, the first input being coupled to the input of the modulator in order to receive the digital input value or a value derived therefrom;
- an integrator comprising an input coupled to the output of the subtractor, and an output; and
- a quantizer having an input coupled to the output of the integrator and an output coupled to the second input of the subtractor. Furthermore, the output of the quantizer is coupled to the output of the modulator in order to deliver the digital output value or a contribution thereto. The quantizer has a specified quantization interval.

In practice, the input of the modulator receives successive values of a digital input signal, occupying a passband much lower than the sampling frequency. The corresponding output values form an output signal, which is a digital signal.

A particularly awkward problem for implementing such a modulator resides in the unpredictable (except for exhaustive simulations which in practice are sometimes unachievable) appearance of limit cycles. These limit cycles depend on the value of the input signal, on the architecture of the $\Sigma$-$\Delta$ modulator and on the initial conditions. They are apparent from the concentration of a considerable part of the output signal power in a small number of lines (lines with a power value which is higher than the local mean value). These situations impair the desired encoding performance by increasing the power of the encoding noise in the passband of the useful signal.

Analysis of the behaviour of a digital to digital $\Sigma$-$\Delta$ modulator comes within the study of systems called "sequential Mealy machines" and of non-linear servo-control systems. The "harmonic" analysis of a digital to digital $\Sigma$-$\Delta$ modulator makes it possible to predict its transfer function and its encoding performance by assuming that the quantizer introduces an encoding error, the spectrum of which is that of decorrelated white noise for the input signal. With this assumption, the behaviour of the $\Sigma$-$\Delta$ modulator according to the simulation is predicted, except during the appearance of limit cycles.

It has not been possible to describe any device having the encoding of properties a digital to digital $\Sigma$-$\Delta$ modulator without the drawbacks of the existence of unpredictable limit cycles.

SUMMARY OF THE INVENTION

A first aspect of the invention relates to a modulator of the aforementioned type, in which the quantization interval of the quantizer is a prime number.

Thus, as will appear more clearly on reading the following description, this feature makes it possible to extend the duration of the output signal cycles as much as possible. It then follows that, since the energy of this signal is distributed over a larger number of lines, the latter are of lower power. The mechanisms leading to the appearance of limit cycles produce the latter with a decreased power (this phenomenon has been observed during simulation).

A second aspect of the invention relates to a digital frequency synthesizer comprising a phase-locked loop having a variable frequency divider in the feedback path, and further comprising a digital to digital $\Sigma$-$\Delta$ modulator according to the first aspect, in order to encode a signal for controlling the division ratio of the variable frequency divider.

DETAILED DESCRIPTION OF PREFERRED EMBODIMENTS

Figure 1:
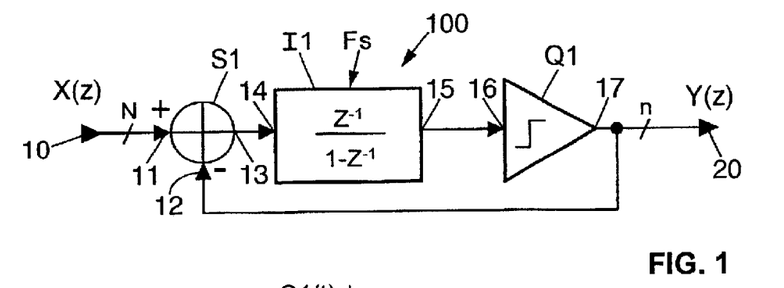
FIG. 1 is a diagram of a digital to digital $\Sigma$-$\Delta$ modulator having a first-order cell.

To illustrate the effect produced by the invention, the case of a digital to digital Σ-Δ modulator, such as the modulator shown schematically in FIG. 1, may be considered. Such a modulator is as simple as possible, since it comprises only a single Σ-Δ cell, and since this cell is of the first order.

The modulator comprises an input 10 in order to receive the successive digital values, each one encoded over N bits, where N is a specified integer, of a digital input signal X. Hereinafter, the letter X denotes both the input signal of the modulator and a particular value of this signal.

The modulator also comprises an output 20 in order to deliver the successive digital values, each one encoded over a given number n of bits, where n is a specified integer less than N, of a digital output signal Y. Hereinafter, the letter Y denotes both the output signal of the modulator and a particular value of this signal.

The signal Y is equivalent to the signal X encoded using the modulator. Since the signal Y is encoded over a number of bits which is smaller than the number of bits used to encode the signal X, an encoding error is introduced. The structure of the digital to digital Σ-Δ modulator makes it possible to shape this encoding noise (or quantization noise).

The exemplary embodiment of the modulator illustrated by FIG. 1 comprises a single Σ-Δ cell, denoted 100. In this embodiment, the cell 100 is of the first order. It comprises the following elements:

- a subtractor S1 comprising a first input 11, a second input 12 and an output 13. The input 11 is coupled to the input 10 of the modulator in order to receive the digital input value X;
- an integrator I1 comprising an input 14 and an output 15. The input 14 is coupled to the output 13 of the subtractor S1. The output 15 delivers a signal I encoded over n bits. The integrator is a digital integrator. In a known manner, such an integrator may be made in the form of an accumulator register set to a particular sampling frequency $F_s$; and,
- a quantizer Q1 having an input 16 and an output 17. The input 16 is coupled to the output 15 of the integrator I1 in order to receive the signal I delivered thereby. The output 17 is coupled to the second input 12 of the subtractor S1. Furthermore, the output 17 is coupled to the output 20 of the modulator in order to deliver the digital values of the output signal Y at the sampling frequency $F_s$. The quantizer Q1 has a specified quantization interval, denoted q hereinbelow and in the figures.

The output I(t) of the integrator I1 of the first-order modulator is expressed, at the time $t=n \times T_s$, where $T_s$ denotes the sampling period ($T_s = 1/F_s$), by the following equation:

$$I(n \times T_s) = I((n-1) \times T_s) + (X((n-1) \times T_s) - Y((n-1) \times T_s)) \quad (1)$$

Figure 2:
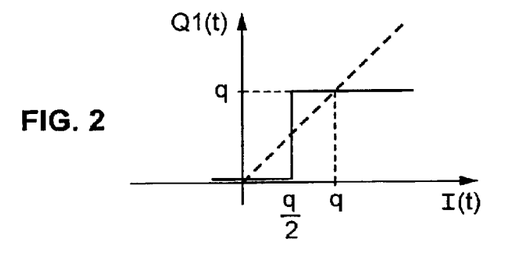
FIG. 2 is a graph showing the properties of a quantizer having two output levels.

The output value Y(t) of the modulator is, for a quantizer having two output levels, for example, equal to q1 if $$I(t) \geq \frac{q}{2},$$

otherwise it is equal to 0. The response of such a quantizer with two output levels is illustrated by the graph of FIG. 2. The signal Y output from the modulator is then encoded over a single bit (n=1).

Figure 3A:
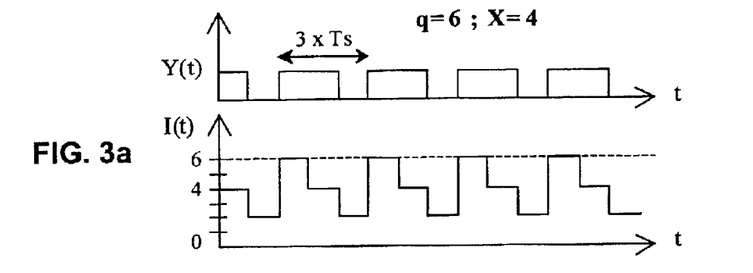
FIGS. 3a to 3d are graphs showing the change, as a function of time, of the signal I at the input of the quantizer and of the output signal Y of a modulator according to FIG. 1, respectively for four specified pairs of values of the input signal X of the modulator and of the quantization interval q of the quantizer.
Figure 3B:
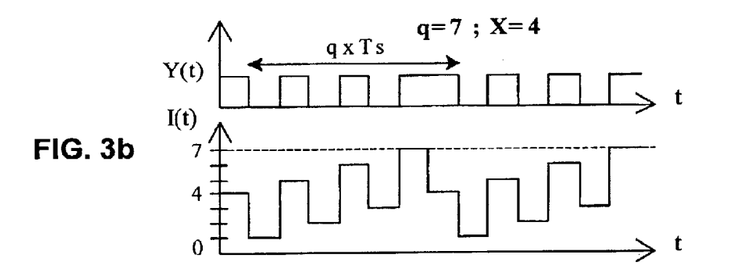
Figure 3C:
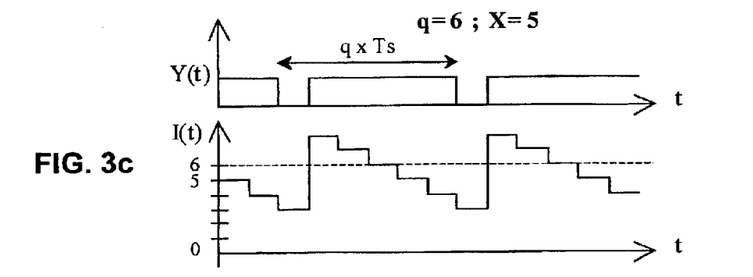
Figure 3D:
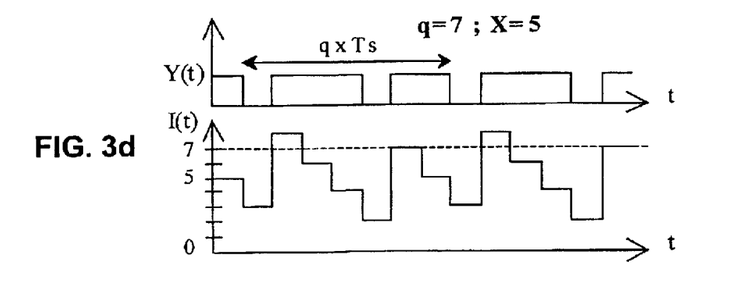

The graphs of FIGS. 3a to 3d show the change, as a function of time, of the signal I at the input of the quantizer Q1 (bottom graph) and of the output signal Y (top graph) of a modulator according to FIG. 1 for four specified pairs of the quantization interval q of the quantizer Q1 and of the value of the input signal X, respectively:

- in FIG. 3a, q is equal to 6 and X is equal to 4 (q1=6; X=4);
- in FIG. 3b, q is equal to 7 and X is equal to 4 (q1=7; X=4);
- in FIG. 3c, q is equal to 6 and X is equal to 5 (q1=6; X=5); and
- in FIG. 3d, q is equal to 7 and X is equal to 5 (q1=7; X=5).

The value I(t) changes with each period $T_s$. Thus, as can be seen, the value of Y also changes with time, thereby being periodic. The period of the signal Y(t) will be denoted T. This period corresponds to the maximum duration of one cycle of the accumulator. The time T is shown on the top graph by a horizontal arrow. In some ways, this is the mean value of the signal Y(t) over a period T which determines the encoded input value X.

For the same value of X, the time T may vary depending on the value of q. Similarly, for the same value of q, the time T may vary depending on the value of X. It can be demonstrated that the period T is defined by the following equation:

$$T = \frac{q}{D} \times T_s \quad (2)$$

where D is the highest common denominator (HCD) between X and q, that is D=HCD (X, q).

Thus, the time T of a cycle is a maximum when the values X and q1 are relatively prime.

FIGS. 4a to 4d show the spectrum of the quantization noise for the four examples corresponding to FIGS. 3a to 3d, respectively, with $F_s$=13 MHz (megahertz) This is a line spectrum in the frequency band close to the sampling frequency $F_s$.

Thus, as can be seen, in each case, the noise spectrum comprises a line 41 at about −12 dB (decibels), at a particular frequency F, such that $$F = \frac{1}{T} = \frac{D}{q} \times F_s.$$

Figure 4A:
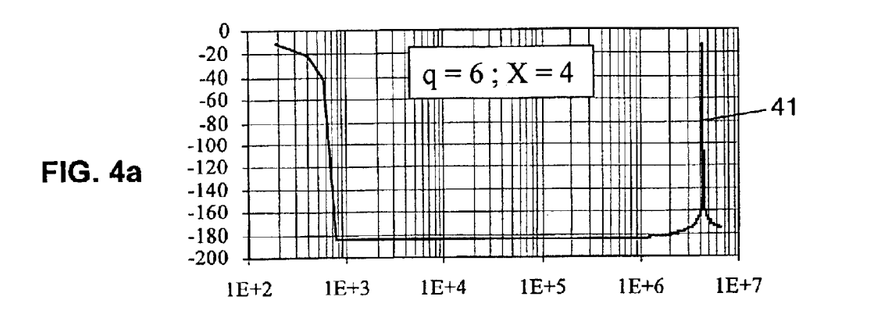
FIGS. 4a to 4d are graphs showing the spectrum of the output signal Y of a modulator according to FIG. 1, respectively for each of the pairs of values of the input signal X of the modulator and of the quantization interval q of the quantizer of FIGS. 3a to 3d.
Figure 4B:
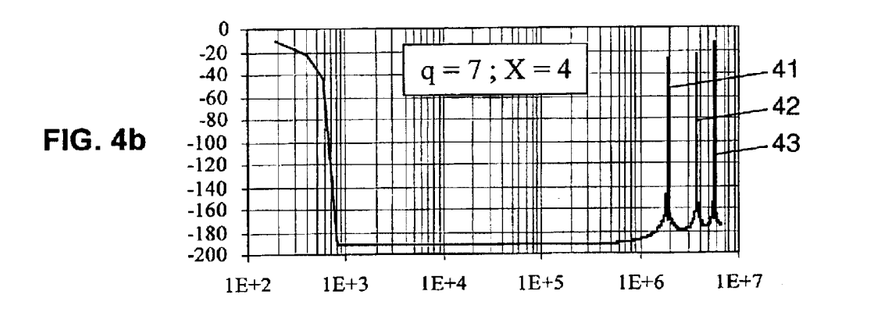
Figure 4C:
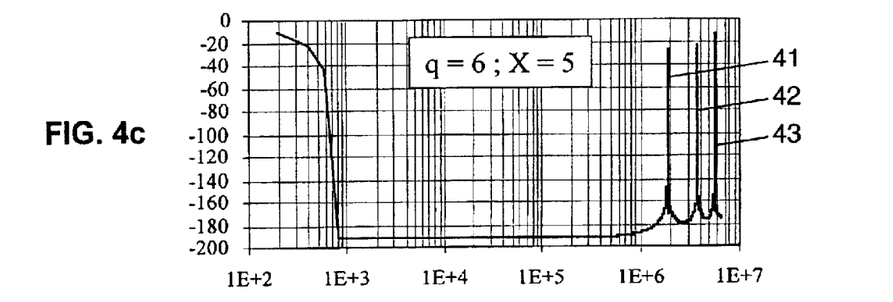
Figure 4D:
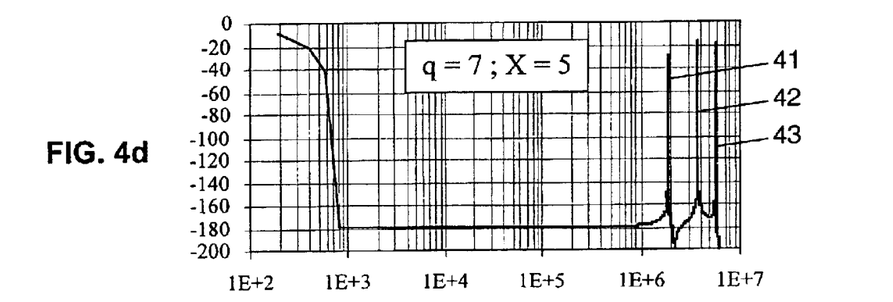

In the case of FIG. 4a, this line 41 is located at the frequency $F=F_s/3$, since D is equal to 2. In the case of FIGS. 4b, 4c and 4d, this line 41 is located at $$\frac{F_s}{q}$$

since D is equal to one. However, in the case of FIGS. 4b, 4c and 4d, the spectrum comprises other lines 42 and 43. It follows that the energy of the quantization noise is distributed between several lines, and is therefore easier to remove by filtering.

It shall therefore be noted that if q and X are relatively prime values, the quantization energy is distributed over a larger number of lines (FIGS. 4b, 4c and 4d) than otherwise (FIG. 4a).

Since no a priori assumption can be made on the values of the input signal X to be encoded, the invention proposes to give the quantization interval q the value of a prime number. The values q and X will therefore always be relatively prime. Their HCD will therefore always be equal to one, such that the time T will always be a maximum. For a Σ-Δ modulator of the first order, this results in a spectrum of the output signal which is independent of the input code, with a minimum line level. In the case of a Σ-Δ modulator of higher order, the limit cycles (appearing for certain input codes) are not removed but they are attenuated.

Of course, the invention is not limited to the case of a quantizer having only two output levels.

Figure 5:
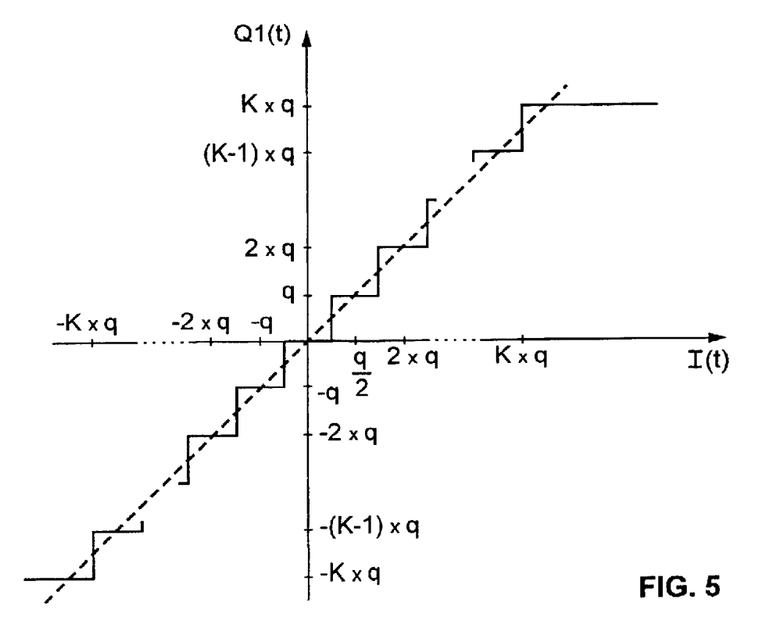
FIG. 5 is a graph showing the response of a quantizer with a given number (2×K)+1 of output levels, where K is an integer.

The graph of FIG. 5 illustrates an example of the response of the quantizer when the latter has a given number (2×K)+1 of different output levels. In this example, the quantization is called uniform since the quantization interval q1 has a constant value whatever the value of the signal I(t). This response is stepped, and corresponds to an examplary quantization called "rounded". This is because any value of the signal I(t) between $$\left(j - \frac{1}{2}\right) \times q \text{ and } \left(j + \frac{1}{2}\right) \times q$$

is rounded to j×q, when j is between −K and K, where K is a specified integer.

It can be noted that, in the case of a quantizer thus having (2×K)+1 output levels, the aforementioned number D is equal to the highest common denominator of the value X and of the value 2×K×q, that is HCD (X, 2×K×q).

Of course, nor is the invention limited to the case of a first-order digital to digital Σ-Δ modulator. The cell 100 of the modulator may be of the second order or more. Furthermore, the modulator may comprise a given number P−1 of other (additional) Sigma-Delta cells, where P is an integer greater than or equal to 2. In this case, the P Sigma-Delta cells are preferably arranged according to a MASH structure. Thus a modulator of order P is obtained, when each cell is of the first order. More generally, the order of the modulator is then the sum of the respective orders of the Sigma-Delta cells of the modulator.

Figure 6:
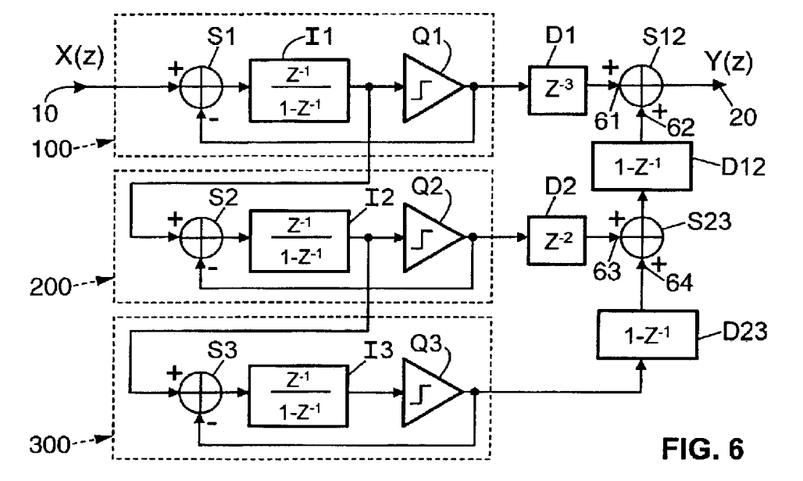
FIG. 6 is a diagram illustrating a digital to digital $\Sigma$-$\Delta$ modulator having three first-order cells arranged according to a MASH structure.

An example of a modulator of this type, comprising three cells 100, 200 and 300, that is for the case where P is equal to three (P=3), is shown schematically in FIG. 6. In this figure, the same elements as in FIG. 1 bear the same references. In this case, in addition to the cell 100, the modulator comprises two additional cells 200 and 300.

Preferably, the three cells have identical structures. This simplifies the production on silicon. In this example, they are first order cells, that is they have the same structure as the cell 100 of the modulator shown in FIG. 1 and described above. The terms "structure of a cell" in this case refer to the overall structure of the cell, that is the type, the number and the arrangement of the elements of which it is formed. These elements have been described above with regard to the cell 100 shown in FIG. 1.

For convenience, the respective subtractors of the cells 100, 200 and 300 will be denoted S1, S2 and S3, respectively. Similarly, the respective integrators of the cells 100, 200 and 300 will be denoted I1, I2 and I3, respectively. Finally, the respective quantizers of the cells 100, 200 and 300 will be denoted Q1, Q2 and Q3, respectively.

The first input of the subtractor S1 of the cell 100 is coupled to the input 10 of the modulator. The output of the quantizer Q1 is coupled to a first input 61 of an adder S12 through a delayer D1. The output of the adder S12 is coupled to the output 20 of the modulator in order to deliver the signal Y.

The first input of the subtractor S2 of the cell 200 is coupled to the output of the integrator I1 of the cell 100. The output of the quantizer Q2 is coupled to a first input 63 of another adder S23 through another delayer D2. The output of the adder S23 is coupled to a second input 62 of the adder S12 through another delayer D12.

The first input of the subtractor S3 of the cell 300 is coupled to the output of the integrator I2 of the cell 200. The output of the quantizer Q3 is coupled to a second input 64 of the adder S23 through another delayer D23.

Stated otherwise, the first input of the subtractor S2 of the second cell 200 receives a signal derived from the input signal X. More specifically, it is coupled to the input 10 in order to receive the signal X through the subtractor S1 and the integrator I1 of the first cell 100. Similarly, the first input of the subtractor S3 of the third cell 300 receives a signal derived from the input signal X. More specifically, it is coupled to the input 10 in order to receive the signal X through the subtractor S1 and the integrator I1 of the first cell 100, and in addition through the subtractor S2 and the integrator I2 of the second cell 200.

The delayer D1 introduces a delay corresponding to three periods $T_s$. Similarly, the delayer D2 introduces a delay corresponding to two periods $T_s$.

The output signal Y results from the additive contribution of the signals delivered by the quantizers Q1, Q2 and Q3 of the cells 100, 200 and 300, respectively.

A MASH structure as described above is known to a person skilled in the art, and its operation does not call for any particular comment.

The respective quantization intervals of the quantizers Q1, Q2 and Q3 of each of the cells 100, 200 and 300, respectively, are all equal to the same prime number denoted q.

Figure 7A:
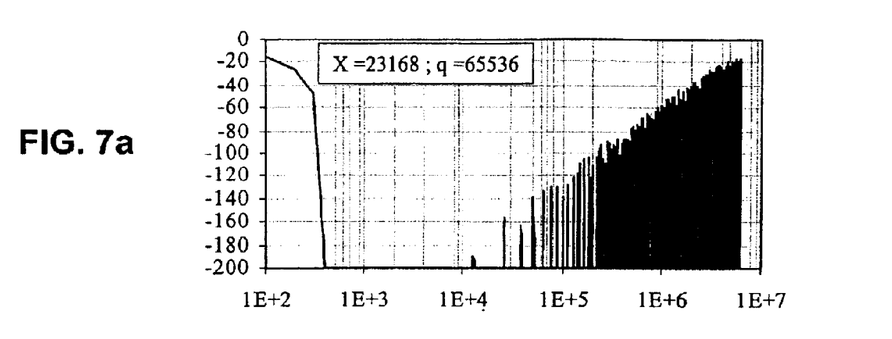
FIGS. 7a to 7d are graphs showing the spectrum of the output signal Y of a modulator according to FIG. 6, each one for a specified pair of values of the input signal X of the modulator and of the quantization interval q of the quantizer.
Figure 7B:
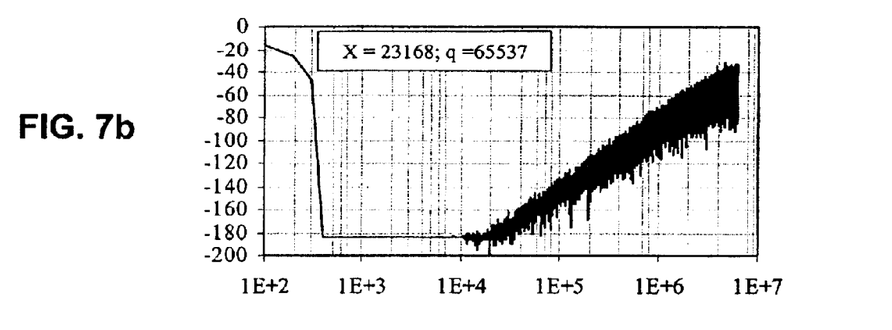
Figure 7C:
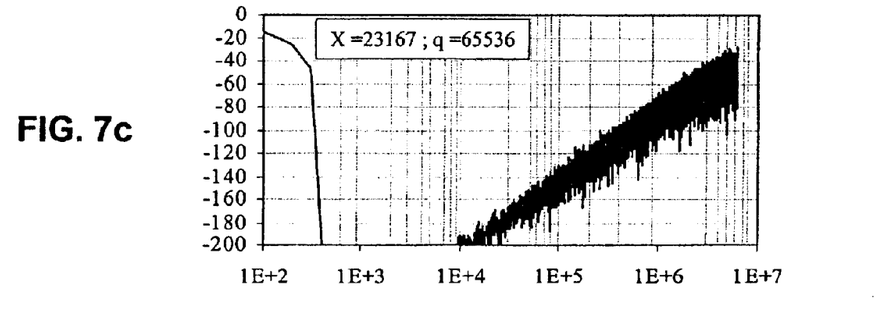
Figure 7D:
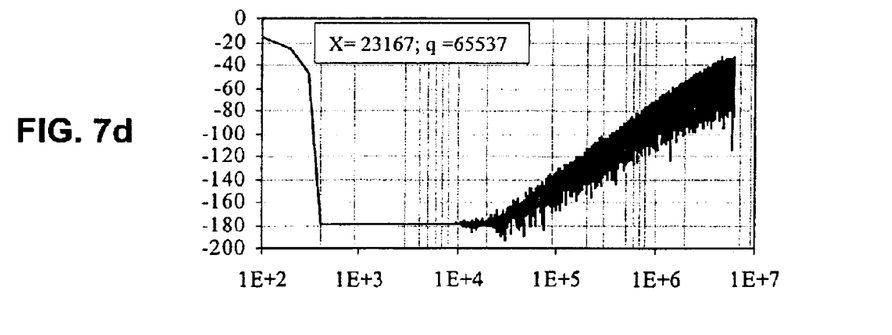

In FIGS. 7a to 7d, graphs showing the spectrum of the output signal Y of a modulator according to FIG. 6 are shown, each one for a specified pair of values of the input signal X of the modulator and of the quantization interval q of the quantizer of each of the Σ-Δ cells, with a quantizer having three output levels (−q, 0 and q) and with Fs=13 MHz:

in FIG. 7a, q is equal to 65536 and X is equal to 23168;
in FIG. 7b, q is equal to 65537 and X is equal to 23168;
in FIG. 7c, q is equal to 65536 and X is equal to 23167; and
in FIG. 7d, q is equal to 65537 and X is equal to 23167.

The numbers 65537 and 23167 are prime numbers. As can be seen, the energy of the quantization noise (high-frequency noise) is distributed over many more lines in the graphs of FIGS. 7b, 7c and 7d than in that of FIG. 7a. Moreover, the level of these lines is clearly much lower than in the case of FIG. 7a, and this whatever the frequencies that are considered between 10 kHz (kilohertz) and 1.5 MHz.

Figure 8:
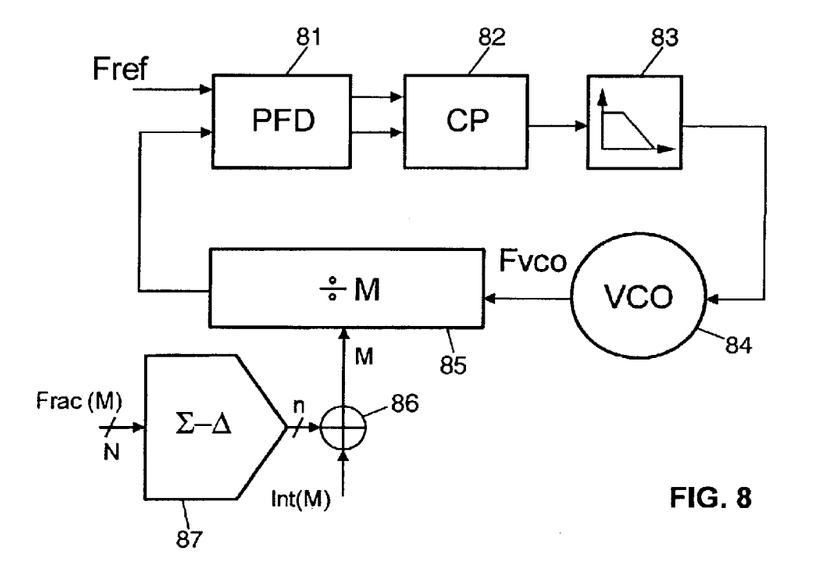
FIG. 8 is a diagram illustrating a digital frequency synthesizer incorporating a digital to digital Σ-Δ modulator according to the invention.

FIG. 8 illustrates diagramatically an exemplary embodiment of a digital frequency synthesizer incorporating a digital to digital Σ-Δ modulator according to the first aspect of the invention.

The synthesizer comprises a phase-locked loop (PLL) with a charge pump. The PLL comprises the following elements in a loop:

a phase frequency detector (PFD) 81;
a charge pump (CP) 82;
a loop filter 83, which is a low-pass filter (integrator);
a voltage controlled oscillator (VCO) 84;
a variable frequency divider 85, the variable ratio of which is denoted M in the figure and hereinafter.

The phase detector 81 detects the phase difference between a reference frequency $F_{ref}$ and the frequency $F_{vco}$ of the output signal of the VCO divided by the ratio M of the frequency divider 85. It applies charge-up and charge-down pulses U and D, respectively, to the charge pump 82. These pulses are used to switch voltage or current sources, which charge or discharge a capacitor of the loop filter 83. The loop filters these pulses and delivers a resulting control voltage to the VCO. The oscillation frequency $F_{vco}$ of the VCO is altered as a function of this control voltage. Thus, the PLL forms a looped system in which the frequency $F_{vco}$ of the signal at the output of the VCO is locked onto the frequency $F_{ref} \times M$. The output from the system is the output from the VCO. The frequency divider is included in the feedback path. It comprises a control signal for the division ratio M, which receives a control signal (also denoted M for convenience) making it possible to change the value of the frequency $F_{vco}$ of the output signal of the PLL.

Thus, as is known per se, the control signal for the division ratio M of the frequency divider 85 is generated by a digital to digital Σ-Δ modulator.

In the example shown, the ratio M comprises an integer part Int(M) and a fractional part Frac(M) which are added in an adder 86. The output of the adder 86 delivers the control signal M. The synthesizer comprises a digital to digital Σ-Δ modulator 87 according to the first aspect of the invention, for example of the type described in FIG. 1 or in FIG. 6, in order to encode the fractional part Frac(M) of the signal M before it is added to the integer path Int(M) of this signal.

Stated otherwise, the modulator 87 receives as an input the signal Frac(M) encoded over N bits, and delivers at the output a corresponding signal encoded over n bits, where n is less than N, which is added to the signal Int(M) in the adder 86 in order to form the control signal for the division ratio M of the frequency divider 85 of the PLL. The interference lines of the signal over n bits at the output of the Σ-Δ modulator are eliminated by the low-pass filtering of the PLL.

In certain applications, the signal Int(M) may determine the frequency of a channel and the signal Frac(M) may be a phase or frequency modulation signal. This is only one example of an application. It is understood that the invention can be used in this type of application, since it makes it possible to preserve the spectral purity of the output signal of the VCO. This is advantageous, in particular, in the applications of the synthesizer to a radio frequency transmitter.

What is claimed is:

1. Digital to digital Sigma-Delta modulator comprising:
    a signal input in order to receive a digital input value encoded over a given number N of bits, where N is an integer;
    an output for delivering a digital output value encoded over a given number n of bits, where n is an integer less than N; and
    at least one first Sigma-Delta cell which comprises:
    a subtractor comprising a first input, a second input, and an output, the first input being coupled to said signal input;
    an integrator comprising an input coupled to the output of the subtractor, and an output; and
    a quantizer having an input coupled to the output of the integrator and an output coupled to the output of the modulator and furthermore coupled to the second input of the subtractor, said quantizer having a specified quantization interval,
    wherein said quantization interval is a prime number.

2. The modulator of claim 1, further comprising a given number P−1 of other Sigma-Delta cells, where P is an integer greater than or equal to 2, the P cells being arranged according to a MASH structure, and wherein the quantization interval of the quantizer of each of said P cells is equal to the quantization interval of the quantizer.

3. The modulator of claim 2, wherein the P−1 other cells have the same structure as the first cell.

4. The modulator of claim 2, wherein the P cells are first order Sigma-Delta cells.

5. The modulator of claim 2, wherein the respective quantization intervals of the quantizers of each of the P cells, respectively, are equal to each other.

6. The modulator of claim 1, wherein said quantizer has $(2 \times K)+1$ output levels, where K is an integer greater than zero.

7. The modulator of claim 1, further comprising a given number P−1 of other Sigma-Delta cells, where P is an integer greater than or equal to 2, the P cells being arranged according to a MASH structure, wherein at least one of said P cells is a second-order or higher Sigma-Delta cell.

8. Digital frequency synthesizer comprising a phase-locked loop having a feedback path and a variable frequency divider in said feedback path, further comprising a digital to digital S-D modulator which encodes a signal controlling the division ratio of said variable frequency divider, wherein said modulator comprises:
    a signal input in order to receive a digital input value encoded over a given number N of bits, where N is an integer;
    an output for delivering a digital output value encoded over a given number n of bits, where n is an integer less than N; and
    at least one first Sigma-Delta cell which comprises:
    a subtractor comprising a first input, a second input, and an output, the first input being coupled to said signal input;
    an integrator comprising an input coupled to the output of the subtractor, and an output; and
    a quantizer having an input coupled to the output of the integrator and an output coupled to the output of the modulator and furthermore coupled to the second input of the subtractor, said quantizer having a specified quantization interval,
    wherein said quantization interval is a prime number.

9. The digital frequency synthesizer of claim 8, wherein the modulator further comprises a given number P−1 of other Sigma-Delta cells, where P is an integer greater than or equal to 2, the P cells being arranged according to a MASH structure, and wherein the quantization interval of the quantizer of each of said P cells is equal to the quantization interval of the quantizer.

10. The digital frequency synthesizer of claim 9, wherein the P−1 other cells have the same structure as the first cell.

11. The digital frequency synthesizer of claim 9, wherein the P cells are first order Sigma-Delta cells.

12. The digital frequency synthesizer of claim 9, wherein the respective quantization intervals of the quantizers of each of the P cells, respectively, are equal to each other.

13. The digital frequency synthesizer of claim 8, wherein said quantizer has $(2 \times K)+1$ output levels, where K is an integer greater than zero.

14. The digital frequency synthesizer of claim 8, further comprising a given number P−1 of other Sigma-Delta cells, where P is an integer greater than or equal to 2, the P cells being arranged according to a MASH structure, wherein at least one of said cells is a second-order or higher Sigma-Delta cell.

15. A method of frequency synthesis, comprising:

providing a frequency synthesizer comprising a phase-locked loop having feedback path and a variable frequency divider in said feedback path; and controlling a division ratio of said variable frequency divider with a digit control signal, wherein said step of controlling comprises generating at least a portion of said digital control signal utilizing digital Sigma-Delta modulator, wherein said step of generating comprises:

receiving a digital input signal encoded over a given number N of bits, where N is an integer;

calculating an intermediate digital value from a digital input signal;

quantizing said intermediate digital value over a specific quantization interval to create a quantized intermediate digital value, wherein said quantization interval is a prime number; and, producing said at least a portion of said digital control signal, encoded over a given number n of bits, where n is an integer less than N, from said quantized intermediate digital value.

16. The method of claim 15, wherein said step of generating further utilizes a given number P−1 of other Sigma-Delta cells, where P is an integer greater than or equal to 2, the P cells being arranged according to a MASH structure, and wherein said step of quantizing quantizes said intermediate digital value over a quantization interval equal to said prime number in each of said P cells.

17. The method of claim 16, wherein the P cells are first order Sigma-Delta cells.

18. The method of claim 16, wherein the respective quantization intervals of said step of quantizing in each of the P cells are equal to each other.

19. The method of claim 15, wherein the step of quantizing creates a quantized intermediate digital value having (2×K)+1 levels, where K is an integer greater than zero.

20. The method of claim 15, wherein said step of generating further utilizes a P−1 other Sigma-Delta cells, where P is an integer greater than or equal to 2, the cells being arranged according to a MASH structure, and wherein at least one of said P cell is a second-order or higher Sigma-Delta cell.

* * * * *